US009578780B1

(12) United States Patent
Shih et al.

(10) Patent No.: US 9,578,780 B1
(45) Date of Patent: Feb. 21, 2017

(54) HEAT DISSIPATING DEVICE

(71) Applicant: CHAUN-CHOUNG TECHNOLOGY CORP., New Taipei (TW)

(72) Inventors: Po-Chou Shih, New Taipei (TW); Heng-Chi Hsu, New Taipei (TW); Tun-Ta Chen, New Taipei (TW)

(73) Assignee: CHAUN-CHOUNG TECHNOLOGY CORP., New Taipei (TW)

( * ) Notice: Subject to any disclaimer, the term of this patent is extended or adjusted under 35 U.S.C. 154(b) by 0 days.

(21) Appl. No.: 14/885,450

(22) Filed: Oct. 16, 2015

(51) Int. Cl.
*H01L 23/367* (2006.01)
*H01L 23/427* (2006.01)
*H05K 7/20* (2006.01)
*H01L 23/473* (2006.01)
*H01L 23/467* (2006.01)

(52) U.S. Cl.
CPC ......... *H05K 7/20309* (2013.01); *H01L 23/367* (2013.01); *H01L 23/3677* (2013.01); *H01L 23/427* (2013.01); *H01L 23/467* (2013.01); *H01L 23/473* (2013.01); *H05K 7/20318* (2013.01)

(58) Field of Classification Search
CPC .. H01L 23/427; H01L 23/467; H01L 23/3672; H01L 23/473; H01L 23/367; H01L 23/3677; H01L 21/4882; G06F 1/20; G06F 1/203; G06F 2200/201; H05K 1/0203; H05K 1/0272; H05K 2201/064; H05K 7/2039; H05K 7/20309; H05K 7/20318
USPC ........... 361/697, 690, 702, 703, 679.54, 709
See application file for complete search history.

(56) References Cited

U.S. PATENT DOCUMENTS

| | | | | |
|---|---|---|---|---|
| 6,017,185 A | * | 1/2000 | Kuo | F04D 29/582 165/121 |
| 6,212,074 B1 | * | 4/2001 | Gonsalves | H01L 23/4006 165/185 |
| 6,310,771 B1 | * | 10/2001 | Chien | H01L 23/3672 165/185 |
| 6,330,905 B1 | * | 12/2001 | Lin | H01L 23/467 165/121 |
| 6,415,853 B1 | * | 7/2002 | Tao | H01L 23/4093 165/121 |
| 6,430,049 B1 | * | 8/2002 | Lai | H01L 23/4093 165/80.3 |
| 6,678,160 B1 | * | 1/2004 | Liu | H01L 23/4093 24/457 |
| 2004/0037038 A1 | * | 2/2004 | Kun | H01L 23/4093 361/695 |

(Continued)

*Primary Examiner* — Adam B Dravininkas
(74) *Attorney, Agent, or Firm* — Chun-Ming Shih; HDLS IPR Services

(57) ABSTRACT

A heat dissipating device used for a PCB having a heat generating component includes a vapor chamber, a fin set, and a fixture. The vapor chamber is attached to the heat generating component. The fin set is connected above to the vapor chamber. The fixture is fixed to the PCB. The vapor chamber and the fin set are clamped between the fixture and the PCB. The fixture has a press plate which is pressed against a top of the fin set. Therefore, the press plate presses the vapor chamber without direct contact. That is, the applied pressure is concentrated on the fin set and then distributed evenly to the vapor chamber, which prevents deformation of the vapor chamber due to uneven pressure and further achieves the effect of the vapor chamber being attached smoothly to the heat generating component.

8 Claims, 5 Drawing Sheets

(56) References Cited

U.S. PATENT DOCUMENTS

2005/0111196 A1\* 5/2005 Wang .................. H01L 23/4093
361/719

\* cited by examiner

HEAT DISSIPATING DEVICE

BACKGROUND OF THE INVENTION

Field of the Invention

The present invention relates to a heat dissipating device, in particular, to a heat dissipating device which is used to dissipate the heat generated by the electronic components.

Description of Related Art

With the prevailing application of 3C products by people, the operating speed and performance of the electronic components such as the CPUs in the 3C products are required to be improved constantly. As a result, the electronic components generate more and more heat. However, if the electronic components keep operating at a high temperature, the operating efficiencies will be affected. Thus, a heat dissipating device is usually used by the industry to facilitate the cooling of the electronic components.

A vapor chamber uses the circulation mechanism of evaporation and condensation of a working fluid sealed in a plate-shaped chamber, which can make the heat generated by the electronic components be dissipated more quickly and evenly. Therefore, a traditional heat dissipating device comprises a frame and a vapor chamber. The frame is fixed to the PCB (Printed Circuit Board) and is pressed against the external edge of the vapor chamber to force the vapor chamber to be attached to the electronic components to enhance the efficiency of heat dissipation.

However, the above traditional heat dissipating device has the following disadvantages. Because the vapor chamber has a plate shape, the vapor chamber is prone to deform from the point of pressure concentration when being pressed. When the frame is pressed against the external edge of the vapor chamber, the external edge of the vapor chamber will be bent slightly toward the PBC and the central portion of the vapor chamber will protrude far away from the PCB. Consequently, the vapor chamber cannot be attached smoothly to the electronic component, which further reduces the heat dissipation efficiency of the heat dissipating device.

In view of this, the inventor pays special attention to research with the application of related theory and tries to overcome the above disadvantages regarding the above related art. Finally, the inventor proposes the invention which is a reasonable design and overcomes the above disadvantages.

SUMMARY OF THE INVENTION

It is an objective of the present invention to provide a heat dissipating device which uses a press plate to press against a fin set such that the press plate presses a vapor chamber without direct contact. That is, an applied pressure is first concentrated on the fin set and then distributed evenly to the vapor chamber, which prevents deformation of the vapor chamber due to uneven pressure and achieves the effect of the vapor chamber being attached smoothly to the heat generating component.

To achieve the above objective, the present invention provides a heat dissipating device used for a PCB having a heat generating component. The heat dissipating device comprises a vapor chamber attached to the heat generating component, a fin set connected above to the vapor chamber, and a fixture fixed to the PCB. The vapor chamber and the fin set are clamped between the fixture and the PCB. The fixture has a press plate which is pressed against a top portion of the fin set.

The present invention still has the following effects.

First, the press plate protrudes to form plural protrusions and the fin set is provided with plural recess slots in which the protrusions are respectively embedded in the recess slots and connected against the fin set. Thus, the pressure strength applied to the vapor chamber by the press plate is increased and the more strong attachment between the vapor chamber and the heat generating component is formed.

Second, the protrusions are respectively embedded in the recess slots. In this way, when the protrusions apply pressure to the vapor chamber, the thickness of the heat dissipating device does not increase. Also, it is convenient for the press plate to be positioned on the fin set, which has the advantages of easy delivery and simply assembly for the heat dissipating device.

Third, the fixture is fixed to the PCB by means of the fasteners. The vapor chamber is provided with plural throughholes. The fasteners are respectively passed through and fixed to the throughholes. In this way, the vapor chamber is positioned by the fasteners such that the vapor chamber cannot be moved and is attached against the heat generating component more firmly.

Fourth, a separating space is formed between any two adjacent legs. The separating space receives an extending portion extending from the fin set. The extending portion is engaged with the corresponding two adjacent legs. In this way, the fin set is positioned by the fixture to enhance the structural stability of the heat dissipating device.

DETAILED DESCRIPTION OF THE INVENTION

As for the characteristics and technical details of the present invention, please refer to the following detailed description and accompanying figures. However, the accompanying figures are only for reference and explanation, but not to limit the scope of the present invention.

Please refer to FIGS. 1-5. The present invention provides a heat dissipating device 10 which comprises a vapor chamber 1, a fin set 2, and a fixture 3.

Figure 1:
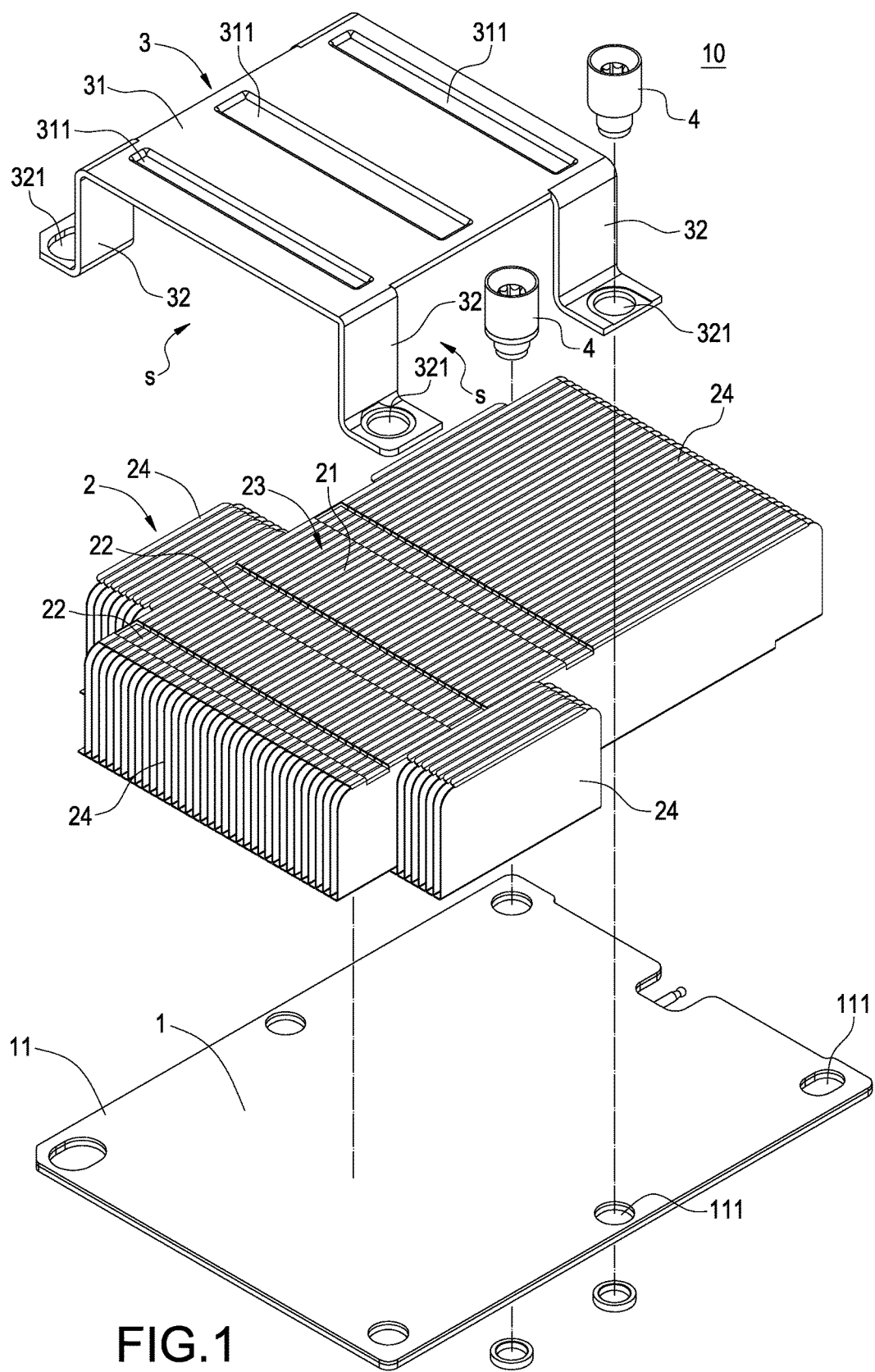
FIG. 1 is a perspective exploded view of the heat dissipating device of the present invention.
Figure 2:
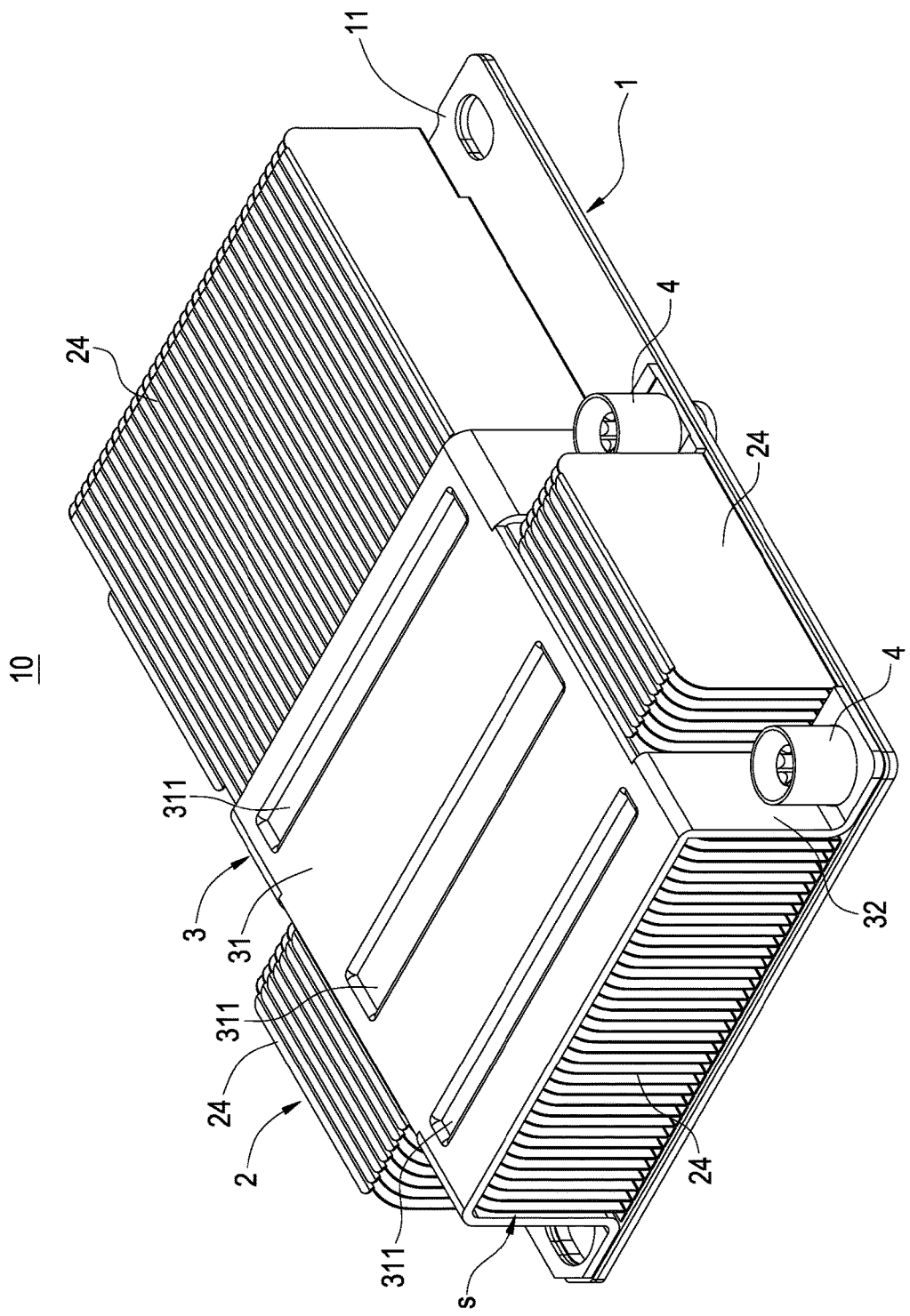
FIG. 2 is a perspective assembled view of the heat dissipating device of the present invention.
Figure 3:
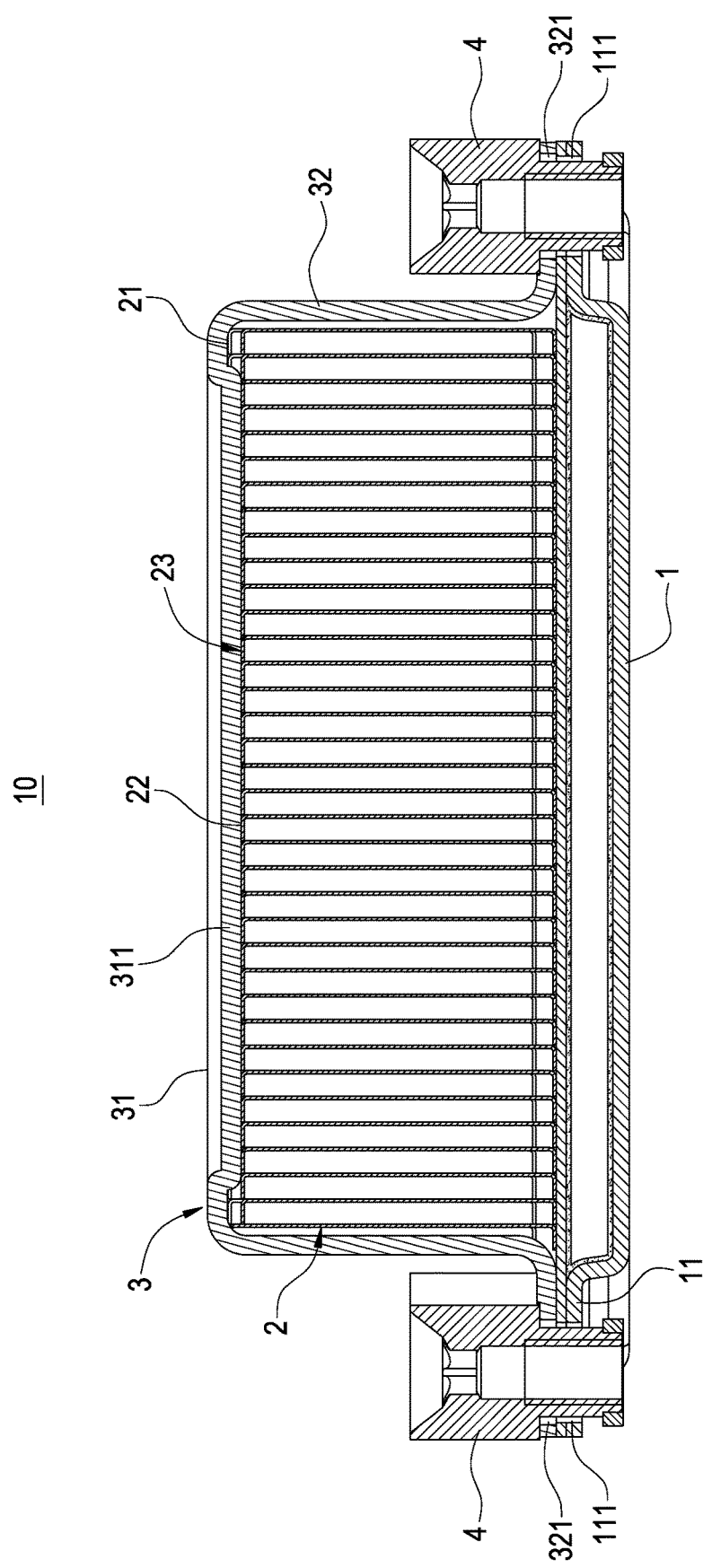
FIG. 3 is a cross-sectional schematic view of the heat dissipating device of the present invention.
Figure 4:
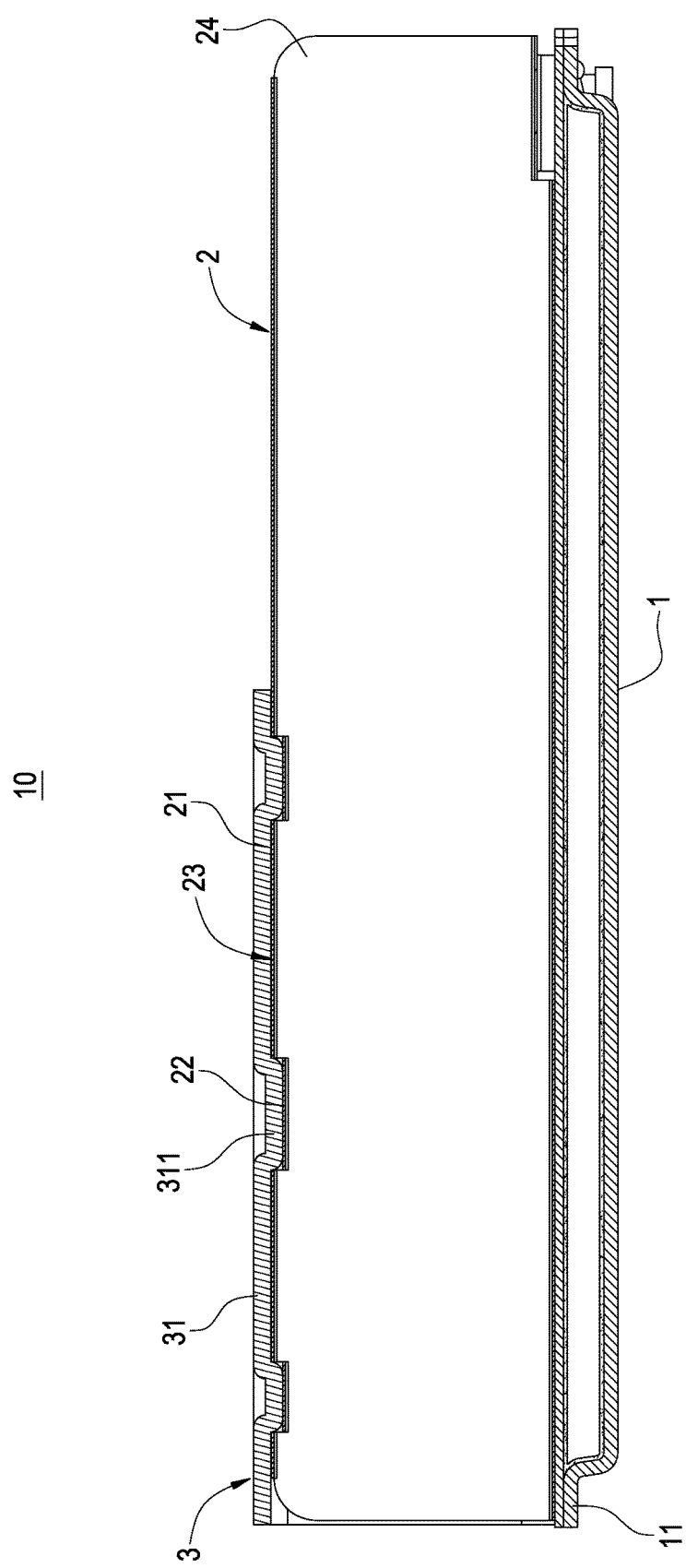
FIG. 4 is another cross-sectional schematic view of the heat dissipating device of the present invention.
Figure 5:
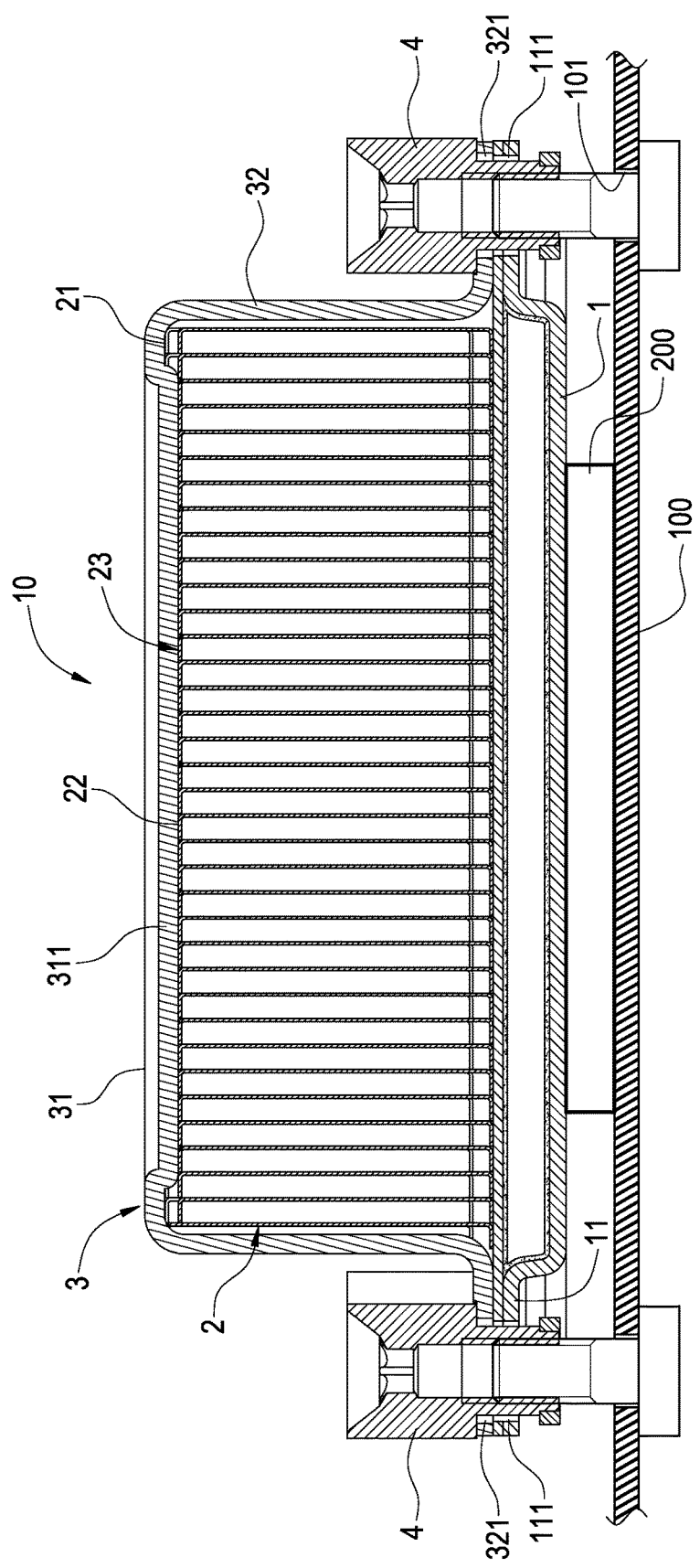
FIG. 5 is a schematic view of the heat dissipating device of the present invention in operation.

As shown in FIG. 5, the heat dissipating device 10 is used for a PCB 100. The PCB 100 has a heat generating component 200. The PCB 100 is provided with a plurality of first fixing holes 101.

As shown in FIGS. 1-5, the vapor chamber 1 is attached to the heat generating component 200. An end plate 11 is extended from an external edge of the vapor chamber 1 and provided with a plurality of throughholes 111.

As shown in FIGS. 1-5, the fin set 2 is connected above to the vapor chamber 1. A plurality of recess slots 22 are disposed at the top portion 21 of the fin set 2 and the fin set 2 has a central area 23 located at the center thereof.

As shown in FIGS. 1-5, the fixture 3 is fixed to the PCB 100. The vapor chamber 1 and the fin set 2 are clamped between the fixture 3 and the PCB 100. The fixture 3 has a press plate 31 which is pressed against the top portion 21 of the fin set 2 such that the fin set 2 is pressed by the vapor chamber 1 and thus the vapor chamber 1 is thermally attached against the heat generating component 200 more firmly.

The detailed description is given below. There is not any opening formed on the press plate 31 such that the press plate 31 can press against the whole of the central area 23. Also, the press plate 31 protrudes to form a plurality of protrusions 311. The protrusions 311 are respectively embedded in the recess slots 22 and connected against the fin set 2 in which each of the protrusions 311 is formed by punching from the press plate 31 toward the fin set 2.

Moreover, a plurality of legs 32 extend from an external edge of the press plate 31 toward the vapor chamber 1. Each of the legs 32 is provided with a second fixing hole 321. A separating space s is formed between any two adjacent legs 32.

Besides, the legs 32 are disposed at two opposite sides of the fin set 2. The separating space s receives an extending portion 24 extending from the fin set 2. The extending portion 24 is engaged with the corresponding two adjacent legs 32.

Also, the numbers of the legs 32 and the extending portions 24 in the current embodiment are both four. The four extending portions 32 extend from the fin set 2 outward to the right, to the left, to the front, and to the rear, respectively. However, the numbers of the legs 32 and the extending portions 24 can be the other one, not limited to four.

As shown in FIGS. 1-5, the heat dissipating device 10 of the present invention further comprises a plurality of fasteners 4. The fasteners 4 are respectively passed through and fixed to the first fixing holes 101, the throughholes 111, and the second fixing holes 321 to allow the fixture 3 to be fixed to the PCB 100. The fasteners 4 can be buttons, screws, or bolts.

As shown in FIGS. 1-4, the assembly of the heat dissipating device 10 of the present invention is described, which uses the vapor chamber 1 to be attached to the heat generating component 200; the fin set 2 is connected above to the vapor chamber 1; the fixture 3 is fixed to the PCB 100. The vapor chamber 1 and the fin set 2 are clamped between the fixture 3 and the PCB 100; the fixture 3 has a press plate 31 which is pressed against the top portion 21 of the fin set 2. In this way, the press plate 31 press against a fin set 2 such that the press plate 31 presses a vapor chamber 1 without direct contact. That is, an applied pressure is first concentrated on the fin set 2 and then distributed evenly to the vapor chamber 1, which prevents deformation of the vapor chamber 1 due to uneven pressure and achieves the effect of the vapor chamber 1 being attached smoothly to the heat generating component 200. Thus, the heat dissipating device 10 has a high efficiency of heat dissipation.

FIG. 5 shows the heat dissipating device 10 of the present invention in operation in which the fixture 3 is fixed to the PCB 100; the vapor chamber 1 and the fin set 2 are clamped between the fixture 3 and the PCB 100; the press plate 31 is pressed against the top portion 21 of the fin set 2. Thus, the press plate 31 presses a vapor chamber 1 through the fin set 2 without direct contact to make the vapor chamber 1 attached firmly to the heat generating component 200, which achieves the effects of the vapor chamber 1 being thermally attached against the heat generating component 200 more securely and an increase in heat dissipation efficiency of the heat dissipating device 10.

In addition, the press plate 31 presses a vapor chamber 1 through the fin set 2 without direct contact such that the applied pressure is first concentrated on the fin set 2 and then distributed evenly to the vapor chamber 1 to further prevent deformation of the vapor chamber 1 due to uneven pressure and achieve the effect of the vapor chamber being attached more smoothly to the heat generating component in which the fin set 2 may deform due to uneven pressure, but the slight deformation of the fin set 2 does not affect the heat dissipation capability thereof.

Further, the press plate 31 protrudes to form plural protrusions 322 and the fin set 2 is provided with plural recess slots 22 in which the protrusions 311 are respectively embedded in the recess slots 22 and connected against the fin set 2. Thus, the pressure strength applied to the vapor chamber 1 by the press plate 31 is increased and the more strong attachment between the vapor chamber 1 and the heat generating component 200 is formed.

In addition, the protrusions 311 are respectively embedded in the recess slots 22. In this way, when the protrusions 311 apply pressure to the vapor chamber 1, the thickness of the heat dissipating device 10 will not increase. Also, it is convenient for the press plate 31 to be positioned on the fin set 2, which has the advantage of easy delivery and simply assembly for the heat dissipating device 10.

Furthermore, the fixture 3 is fixed to the PCB 100 by means of the fasteners 4. The vapor chamber 1 is provided with plural throughholes 111. The fasteners 4 are respectively passed through and fixed to the throughholes 111. In this way, the vapor chamber 1 is positioned by the fasteners 4 such that the vapor chamber 1 cannot be moved and is attached against the heat generating component 200 more firmly.

Besides, the separating space s is formed between any two adjacent legs 32. The separating space s receives the extending portion 24 extending from the fin set 2. The extending portion 24 is engaged with the corresponding two adjacent legs 32. Thus, the fin set 2 is positioned by the fixture 3 to enhance the structural stability of the heat dissipating device 10.

In summary, the heat dissipating device of the present invention can achieve the expected objective and overcome the disadvantages of the prior art. Also it is indeed novel, useful, and non-obvious to be patentable. Please examine the application carefully and grant it as a formal patent for protecting the rights of the inventor.

What is claimed is:
1. A heat dissipating device (10), used for a PCB (100) having a heat generating component (200), the heat dissipating device (10) comprising:
   a vapor chamber (1) attached to the heat generating component (200);
   a fin set (2) connected above to the vapor chamber (1);
   a fixture (3) fixed to the PCB (100), wherein the vapor chamber (1) and the fin set (2) are clamped between the fixture (3) and the PCB (100), wherein the fixture (3) has a press plate (31) which is pressed against a top portion (21) of the fin set (2); and
   a plurality of fasteners (4), wherein the PCB (100) is provided with a plurality of first fixing holes (101), wherein a plurality of legs (32) extend from an external edge of the press plate (31) toward the vapor chamber (1), wherein each of the legs (32) is provided with a second fixing hole (321), wherein the fasteners (4) are respectively passed through and fixed to the first fixing holes (101) and the second fixing holes (321).

2. The heat dissipating device (10) according to claim 1, wherein the press plate (31) protrudes to form a plurality of protrusions (311), wherein a plurality of recess slots (22) are formed at the top portion (21) of the fin set (2), wherein the protrusions (311) are respectively embedded in the recess slots (22) and connected against the fin set (2).

3. The heat dissipating device (10) according to claim 2, wherein each of the protrusions (311) is formed by punching from the press plate (31) toward the fin set (2).

4. The heat dissipating device (10) according to claim 1, wherein the fin set (2) has a central area (23), wherein the press plate (31) presses against a whole of the central area (23).

5. The heat dissipating device (10) according to claim 1, wherein an end plate (11) is extended from an external edge of the vapor chamber (1) and provided with a plurality of throughholes (111), wherein the fasteners (4) are respectively passed through and fixed to the throughholes (111).

6. The heat dissipating device (10) according to claim 1, wherein the legs (32) are disposed at two opposite sides of the fin set (2).

7. The heat dissipating device (10) according to claim 6, wherein a separating space is formed between any two adjacent legs (32), wherein the separating space receives an extending portion (24) extending from the fin set (2), wherein the extending portion (24) is engaged with the corresponding two adjacent legs (32).

8. The heat dissipating device (10) according to claim 7, wherein the numbers of the legs (32) and the extending portions (24) are both four, wherein the four extending portions (32) extend from the fin set (2) outward to the right, to the left, to the front, and to the rear, respectively.

* * * * *